United States Patent [19]

Gerig

[11] Patent Number: 4,468,795
[45] Date of Patent: Aug. 28, 1984

[54] COUNTING METHOD AND APPARATUS

[76] Inventor: John S. Gerig, 1916 Isaac Newton Square West, Reston, Va. 22090

[21] Appl. No.: 342,028

[22] Filed: Jan. 22, 1982

Related U.S. Application Data

[63] Continuation of Ser. No. 30,800, Apr. 17, 1979, Pat. No. 4,329,571.

[51] Int. Cl.$^3$ ............................................. G06M 9/00
[52] U.S. Cl. ...................................... 377/6; 340/561; 377/12; 328/5
[58] Field of Search ...................... 377/12, 6, 8; 328/5; 340/561, 552, 555

[56] References Cited

U.S. PATENT DOCUMENTS

| | | | |
|---|---|---|---|
| 2,708,746 | 5/1955 | Shaw | 361/81 |
| 2,893,633 | 7/1959 | Van Haagen | 235/98 A |
| 3,020,473 | 2/1962 | Cauley | 377/8 |
| 3,223,319 | 12/1965 | Lucich et al. | 235/98 R |
| 3,384,887 | 5/1965 | Trimble | 340/561 |
| 3,439,358 | 4/1969 | Salmons | 340/552 |
| 3,706,027 | 6/1969 | Grice, Jr. et al. | 324/226 |
| 3,881,353 | 5/1975 | Fathauer | 73/861.41 |
| 3,944,792 | 3/1976 | Sautner | 324/61 P |
| 3,964,041 | 6/1976 | Hinds | 377/6 |
| 4,071,820 | 1/1978 | Mushinsky | 324/61 R |
| 4,112,419 | 9/1978 | Kinoshita et al. | 340/560 |

OTHER PUBLICATIONS

Elektor, Oct. 1978, vol. 4, No. 10, pp. 10-09 to 10-11, "Proximity Detector".

Primary Examiner—John S. Heyman
Assistant Examiner—N. Biase
Attorney, Agent, or Firm—James C. Wray

[57] ABSTRACT

Integrated circuits contained in a rail are passed through cylindrical electrodes. Two electrodes are connected to an oscillator to transmit out of phase fields. A receiving electrode's output has the residual oscillator frequency component removed by a nulling network and summation device, whose output is fed to a band pass amplifier and balanced demodulator, which receives a phase shifted input from the oscillator. Demodulator output components at and above the oscillator frequency are removed by a low pass filter. A demodulator output above the reference voltage triggers a counter.

37 Claims, 3 Drawing Figures

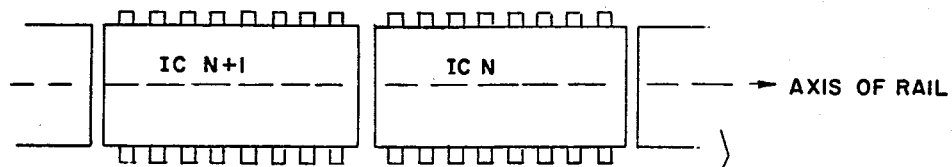
FIG. 1
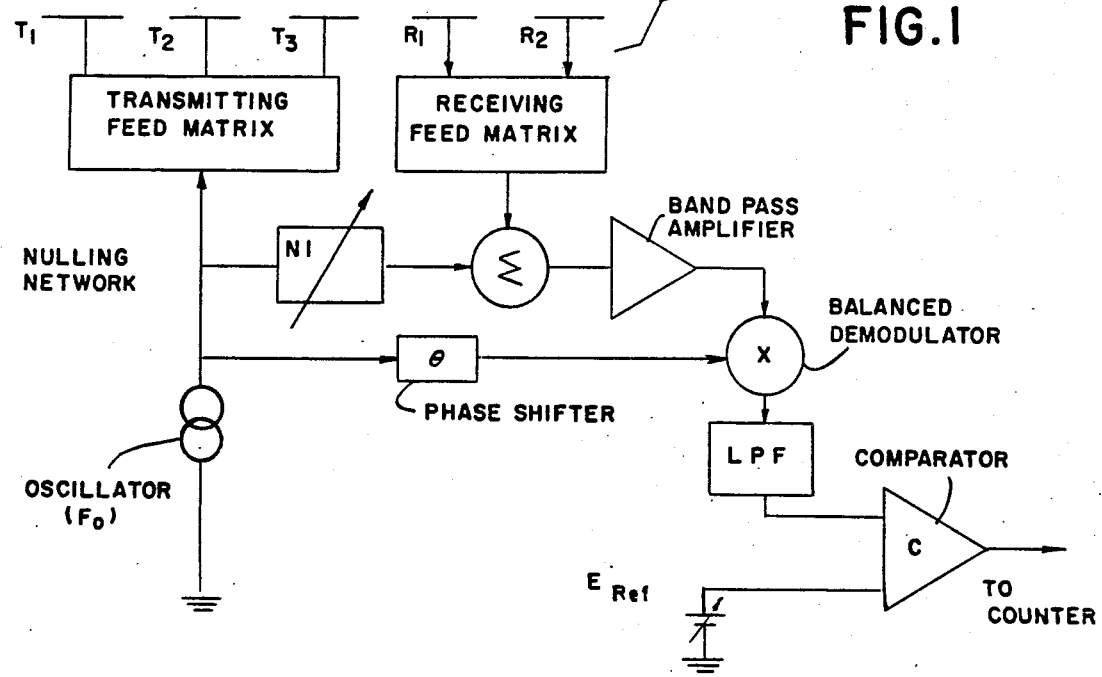
FIG. 2
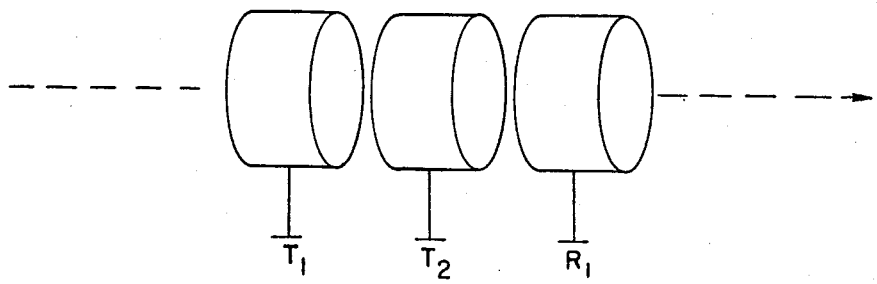

COUNTING METHOD AND APPARATUS

This application is a continuation of application Ser. No. 030,800 filed Apr. 17, 1979 now U.S. Pat. No. 4,329,571.

BACKGROUND OF THE INVENTION

This invention relates generally to a means of rapidly and accurately counting large quantities of objects, and more specifically to counting dual-in-line plastic (DIP) integrated circuits (IC's), packaged, as is customary in the semiconductor industry, in extruded plastic cylinders sometimes called "rails".

An increasingly large fraction of the total product of the semiconductor industry consists of linear and digital integrated circuits. The volume of production and the aggregate economic value of these integrated circuits gives rise to a need for improved methods of counting in order to facilitate inventory control in their manufacture and distribution.

Many of the conventional counting methods are of limited usefulness in the case of IC's packaged in rails. Methods based on weight are handicapped by the substantial and uncertain weight of the rail itself. Labels or other markings on the rail itself, and the lack of an optically conspicuous line of demarkation between contiguous IC's, lead to difficulty in the case of optical counting methods. Magnetic methods are unduly sensitive to variations from type to type in the magnetic properties of IC's and, indeed, some IC's are virtually nonmagnetic.

Possible methods based on electrical capacity typically require that the IC being counted be well separated (singulated) from its neighbors. Also, capacity measuring techniques operating at lower carrier frequencies are adversely affected by the antistatic coating used on rails for IC's.

SUMMARY OF THE INVENTION

The invention described herein overcomes these and other limitations of methods previously considered. In considering the invention is must be understood that each of the multiple leads of a DIP packaged IC is connected electrically to the silicon die which is the IC proper, and that each lead sees an electrical admittance to the substrate of the die equivalent to a few picofarads of capacity in parallel with a more-or-less complex network of semiconductor diodes and transistors. At all but the highest radio frequencies, this admittance is large compared to that corresponding to the capacity of any single lead to a remote ground plane. Accordingly, the leads of an IC can be considered short circuited together insofar as an external electrostatic field is concerned. Thus, each IC can be modeled as an isopotential surface whose voltage is independent of that of neighboring IC's in the rail.

In a preferred embodiment of the invention one or more transmitting electrodes establish a field so that the voltage induced by mutual capacity on a nearby IC varies in a desired manner as the IC moves. Voltage on a particular IC is coupled by mutual capacity to one or more receiving electrodes in a reliable manner as IC's pass, one after the other, through a channel containing the electrodes. The variation is relatively independent of the closeness of spacing of the IC's, so that both isolated and closely packed IC's are counted.

The resulting signal is amplified and applied to a balanced demodulator where it is multiplied with a reference obtained from the oscillator. The demodulator output corresponds to mutual capacity components in the signal picked up by the receiving electrodes.

The output is applied to a voltage comparator where it is compared with reference voltage. The voltage waveform at the output alternates from negative to positive values, reaching a positive maximum as each IC passes in turn through a certain reference plane in the electrode structure. The comparator output switches once for each IC passing through the electrodes. Any of a variety of means can then be used to total and display or otherwise use the count of IC's.

The present invention provides fast, error-free counts of the number of integrated circuits packaged in standard plastic carriers. The unique RF capacity bridge technique used in the counter is unaffected by paper or plastic labels, plastic plugs, rivets or anti-static treatment of the containers.

The counter is intended for use in shipping and receiving departments handling high volumes of dual-in-line integrated circuits. To obtain a count of the IC's in one or more carriers, the operator clears the LED display to zero and passes the carriers, one at a time, but as rapidly as desired, through the appropriate aperture in a sensing head. The total number of IC's counted appears on the LED display of a commercially available counter.

Power and display reset controls are located on the display unit, which is connected by a coaxial cable to the sensing head.

Preferably a smaller counting aperture has a diameter of 0.750 inches and counts 14 through 24 pin dual-in-line IC's having a 0.300" pin spacing. The larger aperture has a one inch diameter and counts 24 through 40 pin IC's having a 0.600" pin spacing. RF signal levels occuring in the sensing head are negligibly low.

A commerical printer output and an IEEE-488 computer interface may be used for the counter.

Integrated circuits mounted on a rail are passed through cylindrical electrodes. Two electrodes are connected to an oscillator to transmit out of phase fields. A receiving electrode's output has the oscillator frequency removed by a nulling network and summation device, whose output is fed to a band pass amplifier and balanced demodulator, which receives a phase shifted input from the oscillator. Frequencies at and above the oscillator frequency are removed by a low pass filter. Signals above the reference voltage are passed to a counter.

An object of the invention is the provision of apparatus for counting IC's having a field producing means, field influence detecting means, means to confine articles to be counted within a field near the producing and detecting means, means for producing a count signal upon detected field influences.

Another object of the invention is the provision of counting apparatus having signal producing means transmitting means connected to the signal producing means for creating a field, receiving means for sensing the field and producing a signal, demodulator means connected to the signal producing means and to the receiving means for comparing the signals, and output means connected to the demodulator means for producing an output count, a signal from the demodulator means.

Another object of the invention is the provision of a method of counting IC's comprising creating a field, passing articles into and out of the field and changing the field thereby, detecting field changes and producing a count signal upon detecting the field changes.

A further object of the invention is the provision of a method of counting IC's which first produces a signal, transmits a field according to the signal, senses field changes and produces a second signal according to articles passing through the field, demodulates one of the first and second signals according to the other of the first and second signals and produces a third signal according to the demodulating, compares the third signal with a reference signal and produces a count signal when the third signal differs in a predetermined manner from a reference signal.

An object of the invention is the provision of a method of counting by producing an electro field, passing articles through the field, altering patterns of the field with articles in the field, sensing the altered patterns, and counting the altered patterns.

A further object is the provision of the method as described wherein the patterns alter according to distinct isopotentials of the articles.

One object of the invention is the provision of the method as described which includes passing articles each having multiple circuits with diverse electronic elements and multiple spaced connectors through the field and altering the field with an isopotential influence of all of the connectors, circuits and elements in each article.

An object of the invention is the provision of integrated circuit counting apparatus having plural electrodes, at least one of which is connected to a field creating means, at least one other electrode connected to a field receiving means, and signal producing means connected to the field creating means and field receiving means for producing a signal which indicates passing of an integrated circuit near the field transmitting means and field receiving means.

Another object of the invention is the provision of the apparatus as described wherein the field creating means includes an oscillator, a transmitting feed matrix connected to the oscillator, and first and second transmitting electrodes connected to the transmitting feed matrix for out of phase excitation of the first and second transmitting electrodes, a phase shifter connected to the oscillator and a demodulator connected to the phase shifter, an adjustable nulling network connected to the oscillator summation means having inputs connected to the field receiving means and to the nulling network, a band pass amplifier connected to the summation means and having an output connected to the demodulator, a low pass filter connected to the demodulator, and a comparator having an input connected to the low pass filter and having a second input connected to a source of reference voltage, the comparator having an output for connection to a counter.

These and further objects and features of the invention are apparent in the disclosure which includes the above and ongoing specification and claims and drawings.

BRIEF DESCRIPTION OF THE DRAWINGS

FIG. 1 is a schematic representation of the counting apparatus and method.

FIG. 2 is a schematic representation of electrodes.

DETAILED DESCRIPTION OF A PREFERRED EMBODIMENT

Figure 3:
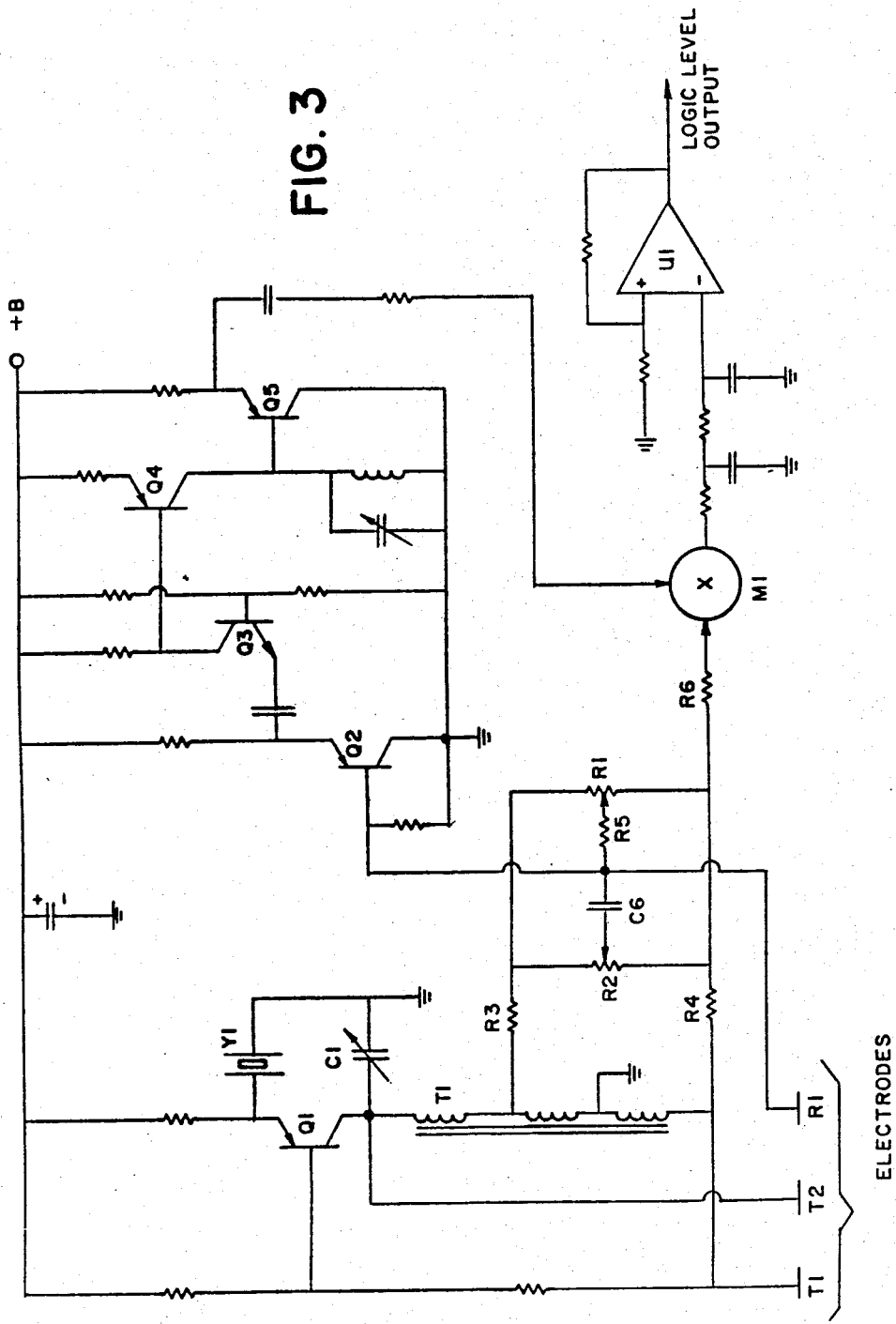
FIG. 3 is a schematic diagram of one apparatus for carrying out the invention.

FIG. 1 is a block diagram of one embodiment of the present invention. In considering FIG. 1, it must be understood that each of the multiple leads of a DIP packaged IC is connected electrically to the silicon die which is the IC proper, and that each lead sees an electrical admittance to the substrate of the die equivalent to a few picofarads of capacity in parallel with a more-or-less complete network of semiconductor diodes and transistors. This admittance is, at all but the highest radio frequencies, large compared to that corresponding to the capacity of any single lead to a remote ground plane. Accordingly, the leads of an IC can be considered short circuited together insofar as an external electrostatic field is concerned. Thus, each IC can be modeled as isopotential surface whose voltage is independent of that of neighboring IC's in the rail.

In the block diagram of FIG. 1 one or more transmitting electrodes (T1, T2, and T3) are driven via a transmitting feed matrix from a signal source at a frequency $F_o$. The feed matrix establishes the amplitudes and phases of the voltages on the transmitting electrodes so that the voltage induced by mutual capacity on a nearby IC varies in a desired manner as the IC, within the rail, moves with the rail along its axis. The voltage on the particular IC is also coupled by mutual capacity to a system of one or more receiving electrodes (R1 and R2) whose outputs are weighted together in a receiving feed matrix. By suitably choosing the weighting factors in the transmitting and receiving matrix, with due regard to the geometry of the electrodes and the geometries of the various sizes of chips to be counted, a phasor representing the electrical output of the receive matrix due to overall mutual capacity between the transmitting and receiving electrodes can be made to vary in a predictable and reliable manner as IC's pass, one after the other, through a channel containing the electrodes. In particular, the variation can be made relatively independent of the closeness of spacing of the IC's, so that both isolated and closely packed IC's can be counted.

An adjustable nulling network N1 whose output is added to the output of the receiving matrix allows the phasor to be shifted parallel to itself, and in particular allows any residual mutual capacity between transmitting and receiving electrodes to be nulled out.

The resulting signal is amplified and applied to a balanced demodulator (sometimes referred to as a phase-selective or coherent demodulator) where it is in effect multiplied with a reference obtained from the oscillator whose phase can be suitably adjusted. The demodulator output, passed through a lowpass filter to remove frequency components at and above $F_o$, is proportional to the projection of the phasor against a reference phasor whose angle is determined by the phase shifter. By suitably adjusting the phase shifter, the lowpass filter output can be made to correspond to mutual capacity components in the signal picked up by the receiving electrode, and to be orthogonal to mutual resistance components such as may be produced by partially conductive antistatic coatings on the rail.

The lowpass filter output is applied to a voltage comparator where it is compared with an adjustable reference voltage. When the phase shifter is suitably adjusted, the voltage waveform at the filter output will alternate from negative to positive values, reaching a positive maximum as each IC passes in turn through a certain reference plane in the electrode structure. By setting the voltage reference input to the comparator to somewhat below this positive maximum, the comparator output can by made to switch once for each IC passing through the electrodes. Any of a variety of means can then be used to total and display or otherwise use the count of IC's.

The best choice of electrode number and geometry depends on such factors as the variety of IC's sizes to be accommodated and the degree to which the relative position of the IC's and the electrode can be constrained.

Use of just one electrode for the transmitter and one for the receiver has been found satisfactory in applications where the IC's are well separated. This version proves unreliable in the case of closely-spaced IC's, however, due to the substantial mutual capacity between the IC's. In the latter case, a design using two transmitting electrodes excited out-of-phase together, with a single receiving electrode, has been found satisfactory when used in combination with circular cylindrical electrodes as shown in FIG. 2. The circular geometry of the electrodes has the added advantage that the coupled signal is necessarily invariant to rotation of the rail about its longitudinal axis.

It should be understood that, since the system consisting of transmitting and receiving electrodes together with the associated feed matrixes is a linear reciprocal electrical network, identical results will be obtained if the roles of the transmitting and receiving electrodes are interchanged.

FIG. 3 shows a specific schematic used in combination with the electrode system of FIG. 2. Transistor Q1 is a low level oscillator whose frequency is fixed at 9 MHz by crystal Y1. Transformer T1, tuned to 9 MHz by C1, provides out-of-phase excitation to the transmitting electrodes with a voltage ratio of 8:1. Potentiometers R1 and R2 allow independent control of the in-phase and quadrature component outputs of a nulling network including R3, R4, R5 and C6.

Transistors Q2 through Q5 provide approximately 60 dB of voltage gain at 9 MHz. The output of emitter-follower Q5 drives a diode quad balanced demodulator M1 whose reference input is obtained via R6 from the Q1 oscillator. Control of relative phase in M1 is by means of a parallel-tuned circuit in the collector of Q4.

A two-section R-C lowpass filter in the output of M1 substantially rejects frequency components above about 20 kHz. Operational amplifier U1 functions as a comparator. Positive feedback around U1 causes the comparator transitions to be fast and decisive.

The frequency of operation used, 9 MHz, has a period short compared to the dielectric relaxation time of the antistatic coating used on the rails, so that loss of signal due to partial shielding is minimized. This radio frequency is at the same time well below any selfresonant frequencies encountered in IC's, so that the electrostatic approximation remains valid.

The invention has been described with reference to specific embodiments. Modifications and variations may be employed without departing from the scope of the invention, which is defined in the following claims.

I claim:

1. A method of counting articles comprising
producing an electric field in a nonconductive medium,
passing articles through the field to induce voltage on said articles,
electronically altering patterns of the field by said passing of articles through the field,
sensing the altered patterns, and
counting the altered patterns.

2. The method of claim 1 further comprising comparing the sensed altered patterns with predetermined patterns and counting altered patterns according to the predetermined patterns.

3. The method of claim 1 wherein the altering patterns comprise altering patterns according to distinct isopotentials of the articles.

4. The method of claim 1 wherein the step of passing articles through the field comprise passing articles each having multiple circuits with diverse electronic elements and multiple spaced connectors and wherein the altering step comprises altering the field with an isopotential influence of all of the connectors, circuits and elements in each article.

5. The method of claim 1 wherein the producing step comprises producing an electrostatic field.

6. A method of counting articles comprising
creating electric fields out-of-phase with each other,
passing articles into and out of the fields, inducing voltage on said articles, and changing the fields thereby,
detecting field changes and producing a count upon detecting the field changes.

7. A method of counting articles comprising producing a first signal, transmitting different fields according to the signal, sensing field changes and producing a second signal according to articles passing through the fields demodulating one of the first and second signals according to the other of the first and second signals and producing a third signal according to the demodulating, comparing the third signal with a reference signal and producing a count when said third signal differs in a predetermined manner from the reference signal.

8. Apparatus for counting articles comprising field producing means for producing electric fields out-of-phase with each other that induce voltage on adjacent articles, field influence detecting means for sensing field changes produced by passing said articles through the fields, means to confine articles to be counted within the fields near the producing and detecting means, means connected to the field influence detecting means for producing a count upon the detecting means detecting field influences.

9. Counting apparatus comprising first signal producing means, transmitting means connected to the first signal producing means for creating plural fields out-of-phase with each other, receiving means for sensing the fields and producing a second signal, demodulator means connected to the first signal producing means and to the receiving means for comparing the first and second signals, and output means connected to the demodulator means for producing an output count upon receiving a signal from the demodulator means.

10. Integrated circuit counting apparatus comprising plural electrodes, at least one of the electrodes connected to field creating means for inducing voltage by mutual capacity on adjacent integrated circuits, said integrated circuits approximating isopotential surfaces, at least one other electrode connected to a field receiving means coupled by mutual capacity to voltage on adjacent circuits, and count producing means connected to the field creating means and field receiving means for producing a count which indicates passing of an integrated circuit near the plural electrodes.

11. The apparatus of claim 10 wherein the field creating means comprises
an oscillator,
a transmitting feed matrix connected to the oscillator, and wherein the plural electrodes comprise
first and second transmitting electrodes connected to the transmitting feed matrix for out-of-phase excitation of the first and second transmitting electrodes.

12. The apparatus of claim 11 further comprising communicating means for communicating a signal from the oscillator to the count producing means.

13. The apparatus of claim 12 where the communicating means comprises a phase shifter having an input connected to the oscillator and wherein the count producing means comprises a demodulator having inputs connected to the field receiving means and to an output of the phase shifter.

14. The apparatus of claim 13 wherein the count producing means further comprises an adjustable nulling network connected to the oscillator, summation means having inputs connected to the field receiving means and to an output of the nulling network, a band pass amplifier having an input connected to an output of the summation means and having an output connected to the demodulator, a low pass filter having an input connected to the demodulator, and a comparator having an input connected to an output of a low pass filter and having a second input connected to a source of reference voltage, the comparator having an output for connection to a counter.

15. The apparatus of claim 10 wherein the electrodes comprise cylindrical electrodes.

16. The apparatus of claim 10 wherein the electrodes comprise cylindrical electrodes aligned on an axis.

17. The apparatus of claim 10 wherein the electrodes further comprise plural electrodes connected to field creating means.

18. The apparatus of claim 10 wherein the field creating means creates fields out-of-phase with each other for producing an accurate count of closely spaced integrated circuits passing near the electrodes.

19. The apparatus of claim 18 wherein the field receiving means includes balanced demodulator means.

20. The apparatus of claim 9, wherein the transmitting means is connected to the first signal producing means for producing fields out-of-phase with each other in a non-conductive medium.

21. The apparatus of claim 8, wherein the field producing means produces fields out-of-phase with each other in a non-conductive medium.

22. The method of claim 7, wherein the transmitting fields comprises transmitting fields out-of-phase with each other.

23. The method of claim 6 wherein the creating fields comprises creating electric fields out-of-phase with each other in a non-conductive medium.

24. The method of claim 1 wherein the producing of an electric field comprises producing plural electric fields out-of-phase with each other.

25. A method of counting articles comprising creating fields out-of-phase with each other in a certain amplitude ratio, detecting and counting field changes, passing contiguous articles into and out of the fields so as to produce field changes, counting field changes to determine the number of articles passed into and out of the fields, and adjusting said amplitude ratio to maximize separate counting of the contiguous articles.

26. The method of claim 25 wherein each of said articles contain terminals, circuit elements, and interconnecting wiring approximating an isopotential surface, said isopotential surface remaining distinct from the isopotential surfaces formed by adjacent articles.

27. The process of individually counting integrated circuits arranged in groups comprising the steps of providing integrated circuits which, because of internal wiring, approximate isopotential surfaces, passing the integrated circuits through a first electric field, counting changes in the field, and passing the circuits through a second electric field in counter-phase to the first electric field to help separately count closely spaced integrated circuits.

28. An apparatus for counting integrated circuits comprising:
first means capacitively coupled to said integrated circuits for inducing on each of said integrated circuits a voltage whose amplitude and phase are a function of the position of each of said integrated circuits;
second means capacitively coupled to said integrated circuits for producing an output signal responsive to said induced voltages on said integrated circuits;
detection means operatively coupled to said second means for detecting the occurence of said output signal in excess of a predetermined reference, and
means for connecting said detection means to counting means whereby said counting means is incremented each time said detection means detects the occurence of said output signal in excess of said predetermined reference.

29. The apparatus of claim 28 in which said first means comprises
a plurality of cylindrical electrodes;
an oscillator providing a signal have a predetermined frequency Fo;
a transmitting feed matrix coupled to said oscillator for producing a plurality of outputs each having a frequency of Fo and predetermined phase and amplitude, and
means connecting said plurality of electrodes to said plurality of outputs in a predetermined manner.

30. The apparatus of claim 28 in which said second means comprises
at least one cylindrical electrode;
a receiving feed matrix connected to each of said electrodes for producing a combined output responsive to said induced voltages sensed by said electrodes; and
means for coherent demodulation of said combined outputs.

31. The apparatus of claim 30 in which said second means further comprises
an adjustable nulling circuit;
means for connecting said nulling circuit to said first means, and
means for summing the output of said nulling circuit with said combined output of said receiving feed matrix whereby voltages induced on said electrodes by mutual capacity with said first means are nulled out.

32. An apparatus for counting integrated circuits comprising a plurality of transmitting electrodes for capacitively inducing a voltage on each of said integrated circuits;

a transmitting feed matrix means having a plurality of outputs;

oscillator means connected to said matrix means whereby each of said outputs of said matrix means produces an output responsive in frequency to said oscillator means;

said transmitting matrix means comprising means for individually adjusting the phase and amplitude of each of said outputs;

means for coupling said transmitting electrodes to said matrix means outputs;

a plurality of receiving electrodes capacitively coupled to said integrated circuits for sensing said induced voltage;

detection means connected to said receiving electrodes for producing a signal indication responsive to the passage of said integrated circuits through a predetermined position, and means for counting said signal indications.

33. An apparatus for counting integrated circuits comprising first means capacitively coupled to said integrated circuits for inducing a voltage on each of said integrated circuits having an amplitude and phase determined by the position of each of said integrated circuits relative to said first means;

second means capacitively coupled to said integrated circuits for sensing said induced voltage on each of said integrated circuits;

osciallator means coupled to said first means for providing a drive signal of predetermined frequency, amplitude, and phase;

adjustable nulling means coupling said oscillator means to said second means for nulling out mutual capacitive coupling between said first means and said second means;

demodulation means coupled to said second means for demodulating said induced voltage sensed by said second means;

phase shifting means coupling said oscillator means to said demodulation means whereby a phase reference is provided for said demodulation means;

detection means responsively coupled to said demodulation means for detecting each occurence of said induced voltage having a predetermined phase with respect to said phase reference and a predetermined amplitude; and counting means coupled to said detection means for counting said detections.

34. An apparatus for counting integrated circuits comprising oscillator means;

circuits means coupled to said oscillator means for producing a first output out-of-phase with a second output;

first transmitting electrode coupled to said first output;

second transmitting electrode coupled to said second output;

a receiving electrode;

a summing amplifier having a first and second input;

means for coupling said receiving electrode to said first input;

an adjustable nulling network;

said adjustable nulling network operatively connecting said oscillator means to said second input for nulling out signals induced in said receiving electrode due to capacitive coupling between said receiving electrode and said first and second transmitting electrode;

a balanced demodulator;

a phase shifting network coupling said oscillator means to said balanced demodulator for providing a phase reference to said demodulator;

means for operatively connecting said balanced demodulator to the output of said summing amplifier whereby the phase and amplitude of the voltage induced capacitively on said integrated circuits by said first and second transmitting electrodes and sensed capacitively by said receiving electrode are demodulated with respect to said reference phase;

comparison means for comparing said demodulated voltage with a predetermined reference and for producing a count signal when said demodulated voltage exceeds said predetermined reference;

means for coupling said comparison means to said balanced demodulator; and means for counting said count signals.

35. An apparatus for counting discrete isopotential surfaces comprising oscillator means;

a transmitting electrode;

means for coupling said oscillator means to said transmitting electrode;

a plurality of receiving electrodes;

a receiving feed matrix connected to said plurality of receiving electrodes in a predetermined manner for combining the outputs of said receiving electrodes whereby the voltage induced on said isopotential surfaces by capacitive coupling from said transmitting electrode and sensed by said plurality of receiving electrodes are combined into a single signal;

a balanced demodulator;

means for coupling said signal to said balanced demodulator for producing a demodulated output;

comparison means coupled to said demodulator for comparing said demodulated output with a predetermined reference; and means for counting coupled to said comparison means.

36. A method for counting isopotential surfaces with an apparatus comprising a first, second, and third cylindrical electrodes aligned along a common axis and in proximity to each other, means for applying out-of-phase excitation of frequency Fo to said first and second electrodes, demodulation means coupled to said third electrode, comparison means connected to said demodulation means, and counting means connected to said comparison means comprising the steps of creating position varying field phasors within said first and second electrodes;

passing said isopotential surfaces axially through said field whereby position varying voltage phasors are capacitively induced on said isopotential surfaces;

capacitively sensing said position varying voltage phasors;

demodulating said voltage phasors;

comparing said demodulated phasors with a predetermined reference; and advancing said counter each time said comparison indicated that said demodulated phasors exceeds said predetermined reference.

37. Counting apparatus comprising plural electrodes, at least one of the electrodes connected to field creating means for inducing voltage on articles passing thereby, at least one other electrode connected to field receiving means for sensing field changes produced by said passing of articles, and count producing means connected to the field creating means and field receiving means for producing a count indicative of the number of said passing articles, said field creating means and field receiving means comprising a linear reciprocal network thereby allowing the electrodes to be interchanged with each other without affecting operation of the apparatus.

* * * * *